United States Patent
Mouri et al.

(10) Patent No.: US 11,482,428 B2
(45) Date of Patent: Oct. 25, 2022

(54) SUBSTRATE PROCESSING APPARATUS AND SUBSTRATE PROCESSING METHOD

(71) Applicant: Tokyo Electron Limited, Tokyo (JP)

(72) Inventors: Nobuhiko Mouri, Kumamoto (JP); Kento Kurusu, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 146 days.

(21) Appl. No.: 16/560,166

(22) Filed: Sep. 4, 2019

(65) Prior Publication Data

US 2020/0083064 A1 Mar. 12, 2020

(30) Foreign Application Priority Data

Sep. 7, 2018 (JP) .............................. JP2018-167588

(51) Int. Cl.
| | | |
|---|---|---|
| *H01L 21/67* | (2006.01) | |
| *H01L 21/683* | (2006.01) | |
| *B08B 1/00* | (2006.01) | |
| *H01L 21/02* | (2006.01) | |
| *B08B 3/08* | (2006.01) | |

(52) U.S. Cl.
CPC ........ *H01L 21/67051* (2013.01); *B08B 1/002* (2013.01); *B08B 3/08* (2013.01); *H01L 21/02041* (2013.01); *H01L 21/67046* (2013.01); *H01L 21/6838* (2013.01)

(58) Field of Classification Search
CPC ......... H01L 21/67046; H01L 21/67051; H01L 21/683; H01L 21/6838
See application file for complete search history.

(56) References Cited

U.S. PATENT DOCUMENTS

| | | | | |
|---|---|---|---|---|
| 2002/0053319 A1* | 5/2002 | Nagamine | ........... | H01L 21/6719 118/52 |
| 2002/0144719 A1* | 10/2002 | Nagamine | ........... | H01L 21/6715 134/153 |
| 2015/0027492 A1* | 1/2015 | Takiguchi | ......... | H01L 21/67051 134/6 |
| 2019/0049845 A1* | 2/2019 | Yoshimura | ............ | G03F 7/3021 |

FOREIGN PATENT DOCUMENTS

JP 2012-023209 A 2/2012

* cited by examiner

*Primary Examiner* — Marc Lorenzi
(74) *Attorney, Agent, or Firm* — Venjuris, P.C.

(57) ABSTRACT

A substrate processing apparatus includes: a substrate holder; a processing liquid supply nozzle that supplies a processing liquid to a substrate held by the substrate holder; a liquid receiving cup that receives the processing liquid supplied to the substrate; a processing chamber that accommodates the liquid receiving cup and has an opening at an upper side; a shield that shields a region outside the liquid receiving cup in the opening of the processing chamber; a driver that moves the liquid receiving cup between a first processing position separated from the shield and a second processing position above the shield; and a processing liquid guide that causes a processing liquid dropped onto the shield to fall downward.

4 Claims, 14 Drawing Sheets

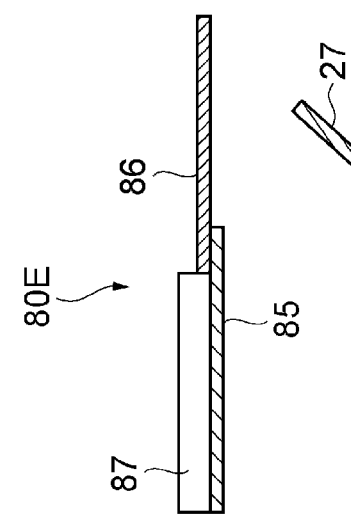
FIG. 10A
FIG. 10B
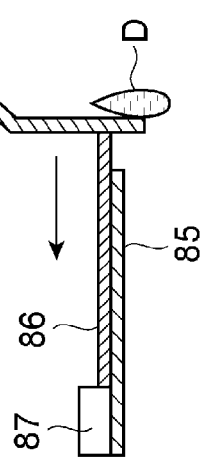
FIG. 10C
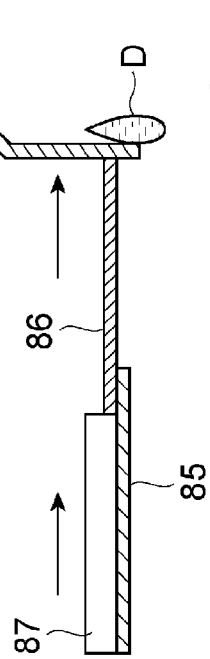
FIG. 10D
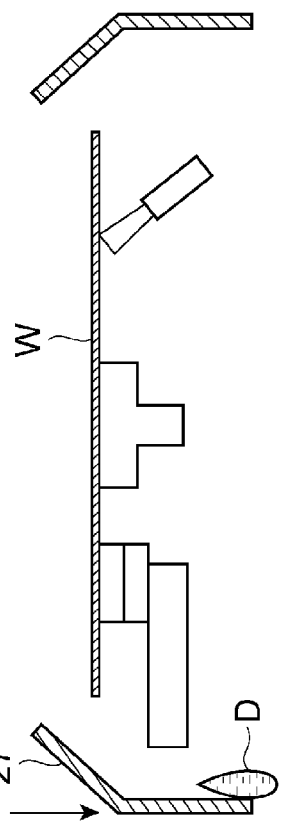

SUBSTRATE PROCESSING APPARATUS AND SUBSTRATE PROCESSING METHOD

CROSS-REFERENCE TO RELATED APPLICATION

This application is based on and claims priority from Japanese Patent Application No. 2018-167588 filed on Sep. 7, 2018 with the Japan Patent Office, the disclosure of which is incorporated herein in its entirety by reference.

TECHNICAL FIELD

The present disclosure relates to a substrate processing apparatus and a substrate processing method.

BACKGROUND

Japanese Patent Laid-Open Publication No. 2012-023209 discloses a substrate cleaning apparatus for cleaning a semiconductor wafer.

SUMMARY

A substrate processing apparatus according to an aspect of the present disclosure includes: a substrate holder; a processing liquid supply nozzle that supplies a processing liquid to a substrate held by the substrate holder; a liquid receiving cup that receives the processing liquid supplied to the substrate; a processing chamber that accommodates the liquid receiving cup and has an opening at an upper side; a shield that shields a region outside the liquid receiving cup in the opening of the processing chamber; a driver that moves the liquid receiving cup between a first processing position separated from the shield and a second processing position above the shield; and a processing liquid guide that causes a processing liquid dropped onto the shield to fall downward.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIGS. 10A to 10D are views for explaining a fifth configuration example of the substrate processing apparatus according to the exemplary embodiment.

DETAILED DESCRIPTION

Figure 1:
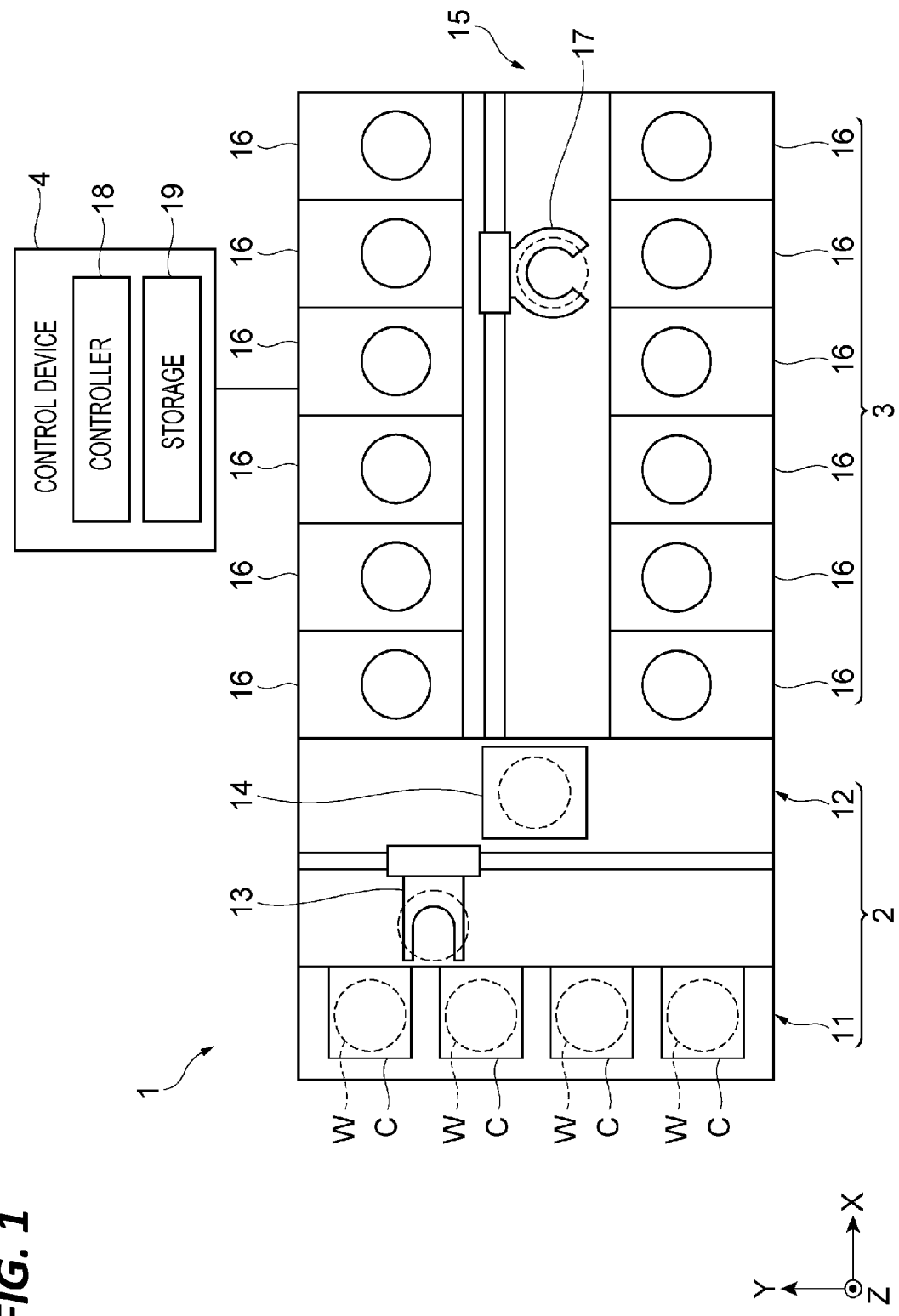
FIG. 1 is a view illustrating a substrate processing system according to an exemplary embodiment.

In the following detailed description, reference is made to the accompanying drawings, which form a part thereof. The illustrative exemplary embodiments described in the detailed description, drawings, and claims are not meant to be limiting. Other exemplary embodiments may be utilized, and other changes may be made without departing from the spirit or scope of the subject matter presented here.

Various exemplary embodiments will be described below.

In an exemplary embodiment, a substrate processing apparatus is provided. The substrate processing apparatus includes: a substrate holder; a processing liquid supply nozzle that supplies a processing liquid to a substrate held by the substrate holder; a liquid receiving cup that receives the processing liquid supplied to the substrate; a processing chamber that accommodates the liquid receiving cup and has an opening at an upper side; a shield that shields a region outside the liquid receiving cup in the opening of the processing chamber; a driver that moves the liquid receiving cup between a first processing position separated from the shield and a second processing position above the shield; and a processing liquid guide that causes a processing liquid dropped onto the shield to fall downward.

In an exemplary embodiment, a substrate processing apparatus is provided. The substrate processing method includes the steps of: holding a substrate; moving a liquid receiving cup which receives a processing liquid supplied to a substrate accommodated in a processing chamber having an opening at the upper side and held by a substrate holder, between a first processing position separated from the shield which shields a region outside the liquid receiving cup in the opening of the processing chamber and a second processing position above the shield; and causing the processing liquid dropped onto the shield to fall downward by the processing liquid guide.

According to the above-described substrate processing apparatus and substrate processing method, when the liquid receiving cup moves, even when the processing liquid falls onto the shield, the processing liquid guide causes the processing liquid which drops onto the shield to fall downward. For this reason, the processing liquid may be prevented from remaining on the shield. Therefore, as compared with a case where the processing liquid remains, the risk of quality deterioration of the substrate due to the remaining processing liquid is reduced and the efficiency of the substrate processing is improved.

In an exemplary embodiment, the shield is configured by stacking two plate-like shielding plates having a plurality of through holes in a thickness direction, and the processing liquid guide may be configured as a through hole which penetrates the two shielding plates in the thickness direction when the two shielding plates are stacked.

As described above, by forming a configuration in which the through holes penetrate in the thickness direction when two shielding plates are stacked, the processing liquid guide may be formed with a simpler configuration, and the substrate processing efficiency is improved with a simpler modification.

In an exemplary embodiment, the substrate processing apparatus may further include a mover that moves one shielding plate of the two shielding plates in the shield along an extending direction with respect to the other shielding plate.

As described above, in the case of adopting a configuration having a mover that moves one of the two shielding plates along the extending direction with respect to the other shielding plate, it is possible to change the shapes of the through holes in the two stacked shielding plates by changing the relative position of the two shielding plates. Therefore, since it is possible to change the shape of the through hole so as to increase the processing efficiency according to the stage of substrate processing, the efficiency of the substrate processing may be enhanced other than when the processing liquid is dropped as the processing liquid guide.

In an exemplary embodiment, the processing liquid guide may be a webbed portion that is attached to the liquid receiving cup and contacts the upper surface of the shield when the liquid receiving cup moves to the second processing position.

As described above, in a case where the processing liquid guide is configured to provide the liquid receiving cup with a webbed portion that contacts the upper surface of the shield when the liquid receiving cup moves to the second processing position, movement of the liquid receiving cup may be utilized to move and drop the processing liquid on the shield. Therefore, the processing liquid guide may be formed without newly providing a complicated structure, and the processing efficiency of the substrate is improved.

In an exemplary embodiment, the substrate processing apparatus may include: a brush that cleans a back surface of the substrate held by the substrate holder; a brush mover that moves the brush between a cleaning position where the cleaning of the substrate is performed and a retracting position where the cleaning of the substrate is not performed; and a partition that divides the processing chamber into a region on the retracting position side of the brush and a region on the substrate holder side. The partition may include: a window that allows the brush and the brush mover moving between the cleaning position and the retracting position, to pass therethrough; and a cover that blocks the window when the brush is in the retracting position.

As described above, by dividing the processing chamber into the region on the retracting position side of the brush and the region on the substrate holder side by the partition, the region on the substrate holder side may be reduced. Therefore, since the effect of processing the substrate such as exhaustion performed on the substrate holder side may be enhanced, the processing efficiency of the substrate is improved. Further, since the partition includes the window and the cover, the movement of the brush is not interfered with, and the cover may be used to partition the two regions more reliably.

In an exemplary embodiment, the cover may be attached to the brush or the brush mover.

When the cover is attached to the brush or the brush mover, it is possible to prevent an increase in size in the vicinity of the substrate holder by providing the cover.

In an exemplary embodiment, the cover may be attached to a body of the partition.

When the cover unit is attached to the body of the partition, the brush may be prevented from being enlarged.

In another exemplary embodiment, a substrate processing apparatus is provided. The substrate processing apparatus includes: a substrate holder; a processing liquid supply nozzle that supplies a processing liquid to a substrate held by the substrate holder; a liquid receiving cup that receives the processing liquid supplied to the substrate; a processing chamber that accommodates the liquid receiving cup and has an opening at an upper side; a shield that shields a region outside the liquid receiving cup in the opening of the processing chamber; and a driver that moves the liquid receiving cup between a first processing position separated from the shield and a second processing position closer to the shield than the first processing position. The shield is provided at a position not overlapping with the liquid receiving cup when viewed from a plan view and constituted by a shielding plate that is provided at the same height position as the liquid receiving cup in a height position.

In another exemplary embodiment, a substrate processing method is provided. The substrate processing method includes: holding a substrate; and moving a liquid receiving cup which receives a processing liquid supplied to a substrate accommodated in a processing chamber having an opening at the upper side and held by a substrate holder, between a first processing position separated from a shield which shields a region outside the liquid receiving cup in the opening of the processing chamber and a second processing position closer to the shield than the first processing position. When the liquid receiving cup is disposed at the second processing position, the shielding plate of the shield is provided at a position not overlapping with the liquid receiving cup when viewed from a plan view, and is provided at the same height position as the liquid receiving cup in a height position.

According to the above-described substrate processing apparatus and substrate processing method, when the liquid receiving cup is disposed at the second processing position, the shield is provided at a position not overlapping with the liquid receiving cup when viewed from a plan view. Further, the shield is constituted by a shielding plate provided at the same height position as the liquid receiving cup in the height position. In the case of the above-described configuration, since the processing liquid does not fall from the liquid receiving cup or the like to the shielding plate, adhesion of the processing liquid on the shield is prevented. Therefore, as compared with a case where the processing liquid remains, the risk of quality deterioration of the substrate due to the remaining processing liquid is reduced and the efficiency of the substrate processing is improved.

In an exemplary embodiment, the shielding plate may be attached to the processing chamber.

When the shielding plate is attached to the processing chamber, the above configuration may be implemented without enlarging the liquid receiving cup itself.

In an exemplary embodiment, the shielding plate may be attached to the liquid receiving cup.

When the shielding plate is attached to the liquid receiving cup, the shielding plate itself moves along with the movement of the liquid receiving cup, so that a mechanism necessary for changing the position of the shielding plate is not necessary.

Various exemplary embodiments will now be described in detail with reference to the drawings. Further, in the respective drawings, the same or corresponding parts will be denoted by the same reference numerals.

[Configuration of Substrate Processing System]

FIG. 1 is a view illustrating a schematic configuration of a substrate processing system according to the present embodiment. In the following, in order to clarify the positional relationship, the X axis, the Y axis, and the Z axis which are orthogonal to one another are defined, and the positive direction of the Z axis is referred to as a vertically upward direction.

As illustrated in FIG. 1, a substrate processing system 1 includes a carry-in/out station 2 and a processing station 3. The carry-in/out station 2 and the processing station 3 are provided adjacent to each other.

The carry-in/out station 2 includes a carrier placer 11 and a transfer section 12. A plurality of carriers C are placed to horizontally accommodate a plurality of substrates, that is, semiconductor wafers in the present embodiment (hereinafter, referred to as "wafers W") in the carrier placer 11.

The transfer section 12 is installed adjacent to the carrier placer 11, and includes a substrate transfer device 13 and a delivery unit 14. The substrate transfer device 13 includes a wafer holding mechanism configured to hold the wafers W. Further, the substrate transfer device 13 is movable horizontally and vertically and pivotable around a vertical axis, and transfers the wafers W between the carriers C and the delivery unit 14 by using the wafer holding mechanism.

The processing station 3 is installed adjacent to the transfer section 12. The processing station 3 includes a transfer section 15 and a plurality of processing units 16. The plurality of processing units 16 are arranged at both sides of the transfer section 15.

The transfer section 15 is provided with a substrate transfer device 17 therein. The substrate transfer device 17 includes a wafer holding mechanism configured to hold the wafers W. Further, the substrate transfer device 17 is movable horizontally and vertically and pivotable around a vertical axis. The substrate transfer device 17 transfers the wafers W between the delivery unit 14 and the processing units 16 by using the wafer holding mechanism.

The processing unit 16 performs a predetermined substrate processing on the wafer W transferred by the substrate transfer device 17 under the control of a controller 18 of a control device 4 (to be described later).

Further, the substrate processing system 1 is provided with the control device 4. The control device 4 is, for example, a computer, and includes a controller 18 and a storage 19. The storage 19 stores a program that controls various processes performed in the substrate processing system 1. The controller 18 controls the operations of the substrate processing system 1 by reading and executing the program stored in the storage 19.

Further, the program may be recorded in a computer-readable recording medium, and installed from the recording medium to the storage 19 of the control device 4. The computer-readable recording medium may be, for example, a hard disk (HD), a flexible disk (FD), a compact disk (CD), a magneto-optical disk (MO), or a memory card.

In the substrate processing system 1 configured as described above, the substrate transfer device 13 of the carry-in/out station 2 first takes out wafers W from a carrier C placed in the carrier placer 11, and then places the taken wafers W on the delivery unit 14. The wafers W placed on the transfer section 14 are taken out from the transfer section 14 by the substrate transfer device 17 of the processing station 3 and carried into a processing unit 16.

The wafers W carried into the processing unit 16 are processed by the processing unit 16, and then, carried out from the processing unit 16 and placed on the delivery unit 14 by the substrate transfer device 17. The processed wafers W placed on the delivery unit 14 are returned to the carrier C of the carrier placer 11 by the substrate transfer device 13.

<Configuration of Substrate Processing Apparatus>

Figure 2:
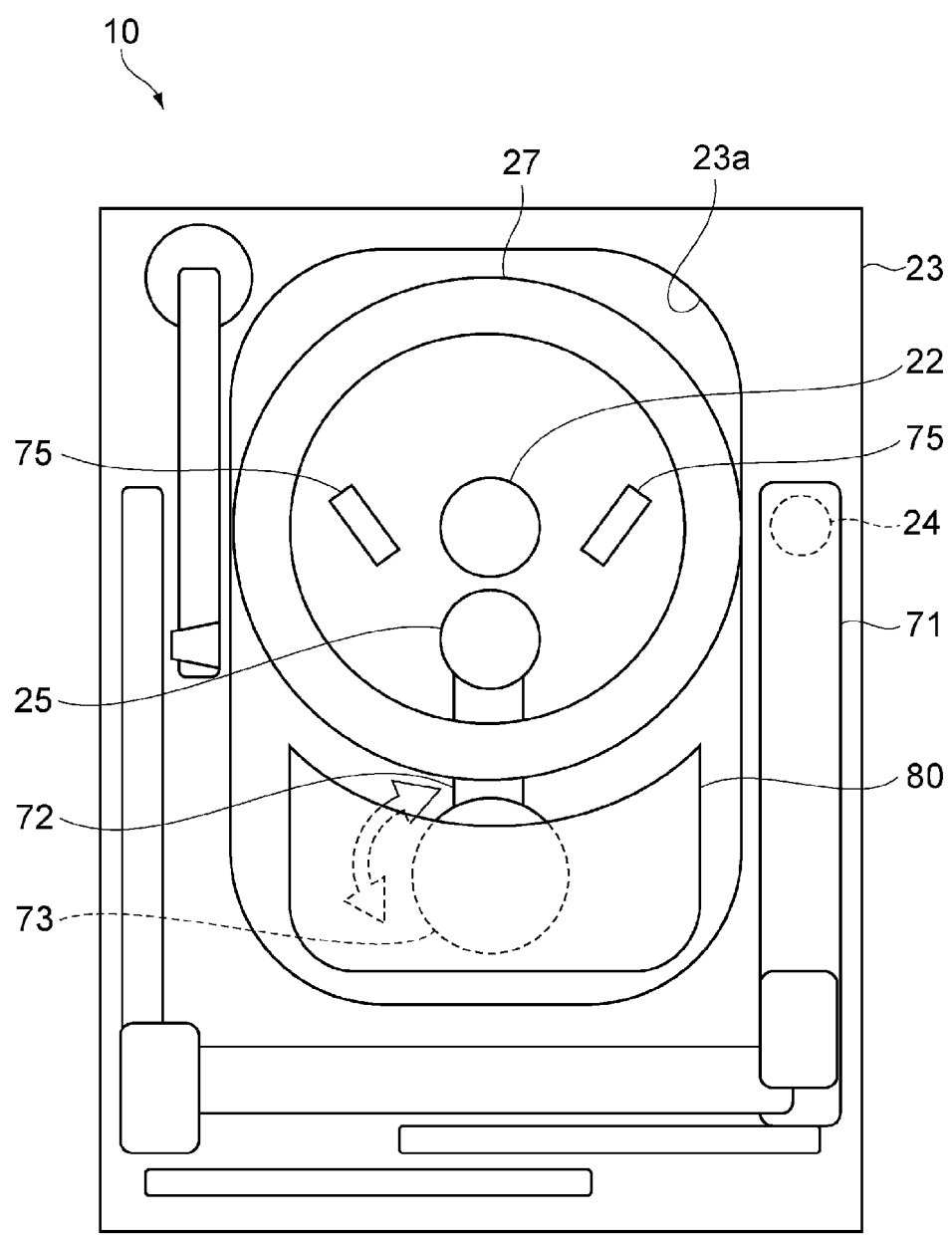
FIG. 2 is a plan view illustrating a substrate processing apparatus according to an exemplary embodiment.

Subsequently, a substrate processing apparatus 10 included in the substrate processing system 1 will be described with reference to FIGS. 2 and 3. The substrate processing apparatus 10 is included in the processing unit 16 of the substrate processing system 1.

The substrate processing apparatus 10 includes two suction pads 21, a spin chuck 22, a housing 23 (processing chamber) having an opening 23a of which the upper surface is opened, a first cleaner 24 that cleans the front surface of the wafer W (see, e.g., FIG. 2), and a second cleaner 25 that cleans the back surface of the wafer W. The suction pad 21 horizontally holds the back surface of a substrate such as a semiconductor wafer or a glass substrate (hereinafter, referred to as a wafer W) by suction. In addition, the spin chuck 22 holds the back surface of the wafer W received from the suction pad 21 horizontally by suction. Further, a circuit is formed on at least one of the front surface and the back surface of the wafer W. The suction pad 21 and the spin chuck 22 function as a substrate holder that holds the wafer W.

The suction pad 21 is formed, for example, in an elongated substantially rectangular shape, and is provided substantially in parallel with the spin chuck 22 interposed therebetween when viewed from a plan view so as to be able to hold a peripheral portion of the back surface of the wafer W. Each suction pad 21 is supported by a substantially rectangular support plate 26 which is longer than the suction pad 21. The support plate 26 supports both ends of the suction pad 21 by a frame (not illustrated) that is freely movable in a horizontal direction (X axis and Y axis directions in FIG. 1) and a vertical direction (corresponding to the Z axis direction in FIG. 1) by a driver 29.

An upper cup 27 (liquid receiving cup) is provided on the upper surface of the frame. That is, the suction pad 21 and the upper cup 27 are connected by the support plate 26 and the frame. Therefore, the suction pad 21 and the upper cup 27 move at the same time by the driving of the driver 29 that moves the support plate 26. An opening having a diameter larger than the diameter of the wafer W is formed on the upper surface of the upper cup 27, and delivery of the wafer W is performed between the transfer mechanism provided outside the substrate processing apparatus 10 and the suction pad 21 via the opening. By having the above-described structure, the upper cup 27 is accommodated in the opening 23a of the housing 23.

Figure 3:
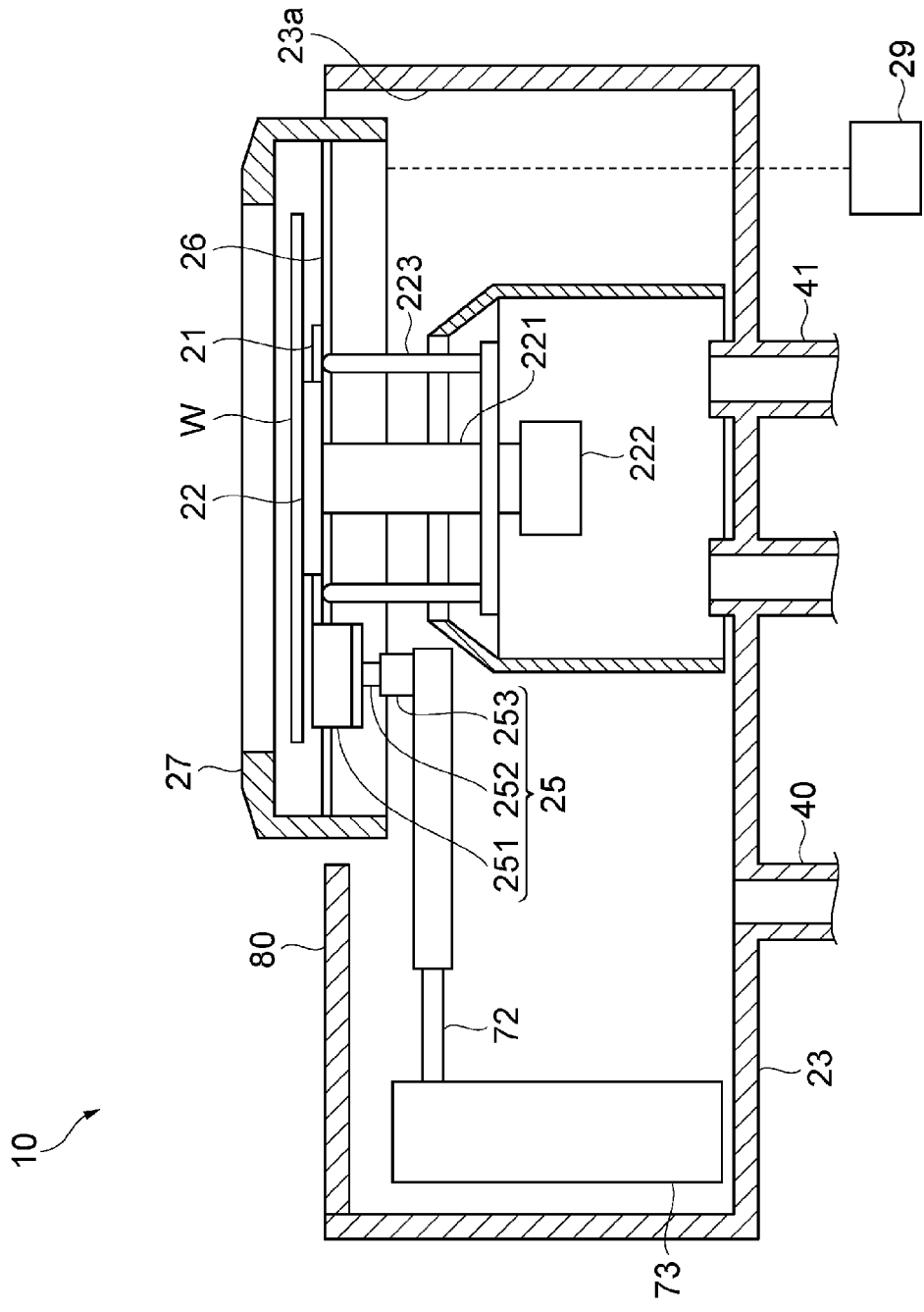
FIG. 3 is a longitudinal cross-sectional view illustrating a substrate processing apparatus according to an exemplary embodiment.

As illustrated in FIG. 3, the spin chuck 22 is connected to a drive mechanism 222 via a shaft 221. The spin chuck 22 is rotatable and vertically movable by the drive mechanism 222.

For example, three lifting pins 223 which may be lifted and lowered by a lifting mechanism (not illustrated) are provided around the spin chuck 22. Thus, the wafer W may be delivered between the lifting pin 223 and a transfer mechanism (not illustrated) provided outside the substrate processing apparatus 10.

A drain pipe 40 that discharges a cleaning liquid and an exhaust pipe 41 that forms a downward air flow in the substrate processing apparatus 10 and exhausts the air flow are provided at the bottom of the housing 23 (the bottom in the opening 23a).

The first cleaner 24 has a function of cleaning the front surface of the wafer W. The first cleaner 24 cleans the front surface of the wafer W by rotating a first cleaning body in a state in which the first cleaning body made of a brush, a sponge, or the like is pressed against the front surface of the wafer W. Further, the first cleaner 24 is horizontally supported by an arm 71. The arm 71 may be provided with a cleaning nozzle that supplies a cleaning fluid such as pure water to the front surface of the wafer W held by the spin chuck 22. The arm 71 is movable, and the movement of the arm 71 changes the position of the first cleaner 24 with respect to the housing 23.

The second cleaner 25 includes a second cleaning body 251, a second support member 252, and a second driver 253.

The second cleaning body 251 is a member pressed against the back surface of the wafer W, and is formed of, for example, a brush, a sponge, or the like made of a large number of hair bundles.

The second support member 252 provided on the lower surface of the second cleaning body 251 extends along the vertical direction (Z axis direction), and supports the second cleaning body 251 at one end thereof. A second driver 253 is provided at the other end of the second support member 252. The second driver 253 rotates the second support member 252 around the vertical axis. Thus, the second cleaning body 251 supported by the second support member 252 may be rotated around the vertical axis.

The second cleaner 25 is horizontally supported by the arm 72. The arm 72 is connected to a mover 73. The mover 73 rotates the arm 72 about an axis in the vertical direction (Z axis direction in FIG. 1: vertical direction), and lifts and lowers the arm 72 along the vertical direction. The second cleaner 25 is a brush that cleans the back surface of the wafer W, and the arm 72 and the mover 73 correspond to a brush mover that moves the brush.

A cleaning nozzle 75 (processing liquid supply nozzle) that supplies a cleaning fluid (processing liquid) such as, for example, pure water to the back surface of the wafer W held by the suction pad 21 or the spin chuck 22 is provided in the opening of the housing 23. In a state where the cleaning fluid is supplied from the cleaning nozzle 75, the second cleaner 25 is pressed against the wafer W to clean the back surface of the wafer W. The cleaning nozzle 75 is movable by a moving mechanism (not illustrated), and the position thereof is appropriately changed according to the cleaning performed using the second cleaner 25.

FIG. 3 illustrates a state in which the second cleaner 25 is within the upper cup 27 by the arm 72. However, during a time period in which the second cleaner 25 does not clean the wafer W, the second cleaner 25 is caused to retract outside the upper cup 27. The retracting position is near the mover 73 illustrated in FIG. 3, and is moved to the vicinity of the mover 73 by the rotation of the arm 72 and the driving in the vertical direction.

A shield 80 is provided above the mover 73. The shield 80 is formed to block a part of the opening of the housing 23, and has a function of collecting the mist scattered below the upper cup 27 by the exhaust pipe 41 by dividing a space that forms the downward air flow in the substrate processing apparatus 10. Therefore, the shield 80 is formed of, for example, a plate-like member made of metal or the like, and is provided at a position not interfering with the upper cup 27, the arm 72 of the second cleaner 25, and the like. The shield 80 may be connected to the housing 23 or may be supported by another frame member or the like in a state of being separated from the housing 23. The shield 80 is provided at a position where the cleaning of the wafer W by the first cleaner 24 and the second cleaner 25 is not prevented. Further, although a gap may be provided between the shield 80 and the housing 23, as the gap becomes smaller, the upper space and the lower space sandwiching the shield 80 may be more clearly distinguished.

<Substrate Processing Method>

Figure 4:
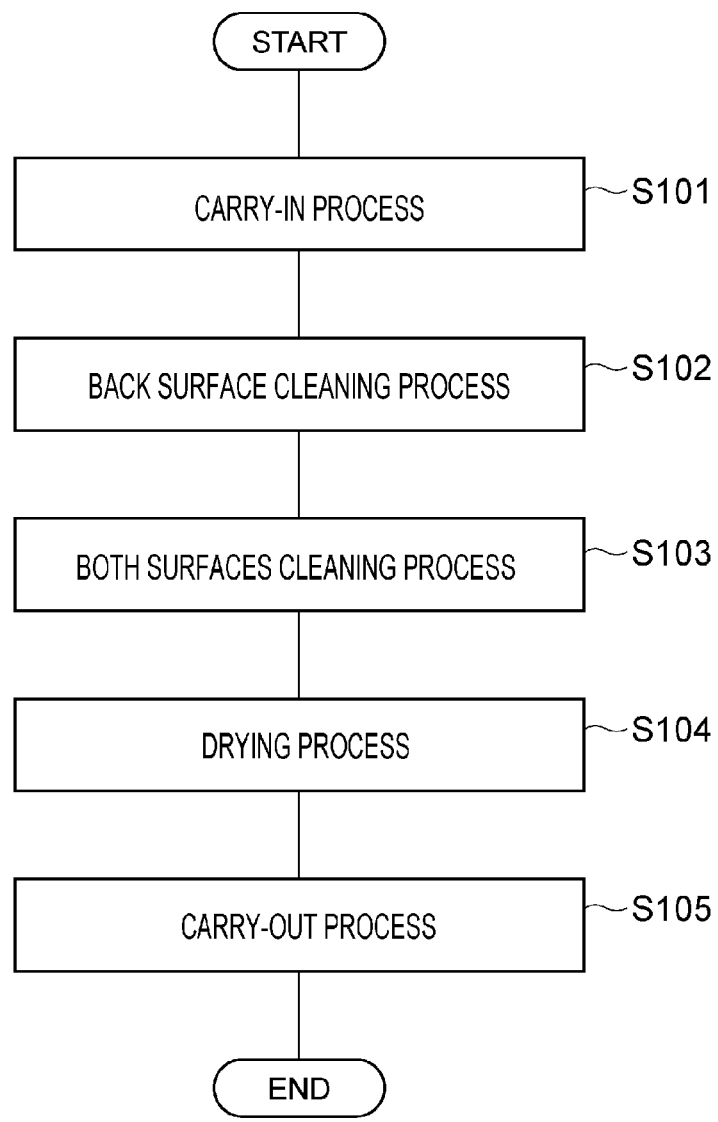
FIG. 4 is a flowchart illustrating the procedure of a substrate processing by the substrate processing apparatus according to the exemplary embodiment.

Next, a cleaning process (substrate processing method) of the wafer W in the substrate processing apparatus 10 will be described. FIG. 4 is a flowchart illustrating the procedure of a series of cleaning processes by the substrate processing apparatus 10.

As illustrated in FIG. 4, a carry-in process is first performed in the substrate processing apparatus 10 (step S101). In the carry-in process, the wafer W is transferred above the upper cup 27 by a transfer mechanism provided outside the substrate processing apparatus 10. Next, the lifting pins 223 move up and the wafer W is then delivered to the lifting pins 223. Thereafter, the lifting pins 223 are lowered, and the wafer W is delivered to the suction pad 21 and held by suction.

Next, the back surface cleaning process is performed (step S102). In the back surface cleaning process, the suction pad 21 holding the wafer W is first moved in the horizontal direction (here, the X axis direction) together with the support plate 26 and the upper cup 27. As a result, the spin chuck 22 is disposed near the outer peripheral portion of the wafer W, and the second cleaner 25 is disposed near the central portion of the wafer W.

Thereafter, the second cleaning body 251 is pressed against the back surface of the wafer W by lifting the second cleaner 25 by the mover 73. At this time, the mover 73 lifts the second cleaner 25 so that the pressing force of the second cleaning body 251 on the wafer W becomes a desired value. Then, the supply of pure water from the cleaning nozzle 75 (see, e.g., FIG. 1) to the back surface of the wafer W is started, and the rotation of the second cleaning body 251 is started.

The cleaning of the back surface of the wafer W by the second cleaner 25 is performed by a combination of the movement of the wafer W by the suction pad 21 with the movement of the second cleaner 25 by the mover 73. The details thereof will be described later.

Next, a both surfaces cleaning process is performed (step S103). In the both surfaces cleaning process, the central portion of the wafer W is first positioned above the spin chuck 22 by the suction pad 21. Next, the suction of the wafer W by the suction pad 21 is released, and the spin chuck 22 is lifted to deliver the wafer W from the suction pad 21 to the spin chuck 22.

In addition, the arm 71 is operated to position the first cleaner 24 above the center of the wafer W, and then the first cleaner 24 is lowered to press the first cleaning body against the front surface of the wafer W.

The wafer W is rotated by rotating the spin chuck 22 using the drive mechanism 222. Further, the supply of pure water from the cleaning nozzle 70a to the front surface of the wafer W is started, and the rotation of the first cleaning body is started. Then, the movement of the arm 71 is used to move the first cleaning body in the horizontal direction. Thus, the central region of the front surface of the wafer W is cleaned by the first cleaning body. Further, the first cleaning body may be pressed against the wafer W after the wafer W and the first cleaning body are rotated.

Thereafter, when the first cleaning body reaches a position where the first cleaning body and the second cleaning body 251 overlap with each other when viewed from a plan view, supply of pure water from the cleaning nozzle 75 (see, e.g., FIG. 1) to the back surface of the wafer W is started, and the rotation of the second cleaning body 251 is started at the same time. The both surfaces cleaning is performed while horizontally moving the first cleaning body and the second cleaning body 251 so that the first cleaning body and the second cleaning body 251 are maintained in an overlapping state when viewed from a plan view. The first cleaning body and the second cleaning body 251 clean both surfaces while moving from the inner peripheral side to the outer peripheral side of the wafer W.

When the first cleaning body and the second cleaning body 251 reach the outer peripheral portion of the wafer W, the rotation of the first cleaning body and the second cleaning body 251 is stopped, and the supply of pure water is stopped. Further, the first cleaning body and the second cleaning body 251 are retracted from the wafer W.

Next, a drying process is performed (step S104). In the drying process, the wafer W is dried by rotating the spin chuck 22 at a high speed to shake off the pure water adhering to the wafer W.

Next, a carry-out process is performed (step S105). In the carry-out process, the wafer W is delivered to the transfer mechanism in the reverse order of the carry-in process (step S101). As a result, a series of cleaning processes for one wafer W are completed.

[Cleaning the Bottom of the Wafer]

Here, with reference to FIGS. 5A to 5C, descriptions will be made on the cleaning procedure of the back surface of the wafer W by the second cleaner 25 in the cleaning process of the back surface of the wafer W (step S102). Further, only a part of the substrate processing apparatus 10 is schematically illustrated in FIGS. 5A to 5C and the subsequence figures.

Figure 5A:
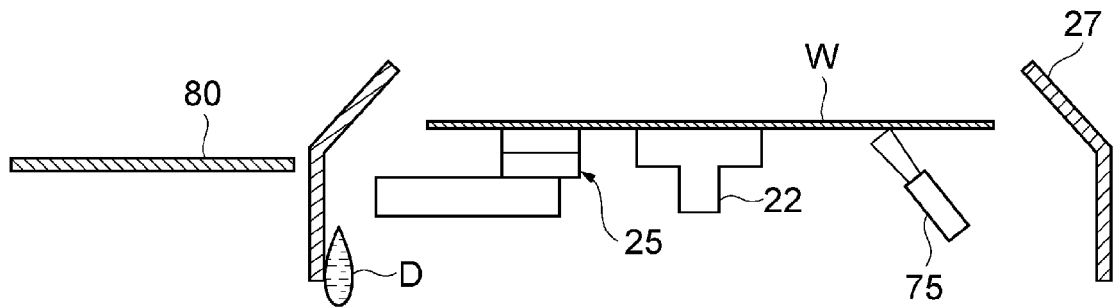
FIGS. 5A to 5C are views for explaining the procedure of a substrate processing in the related art.
Figure 5B:
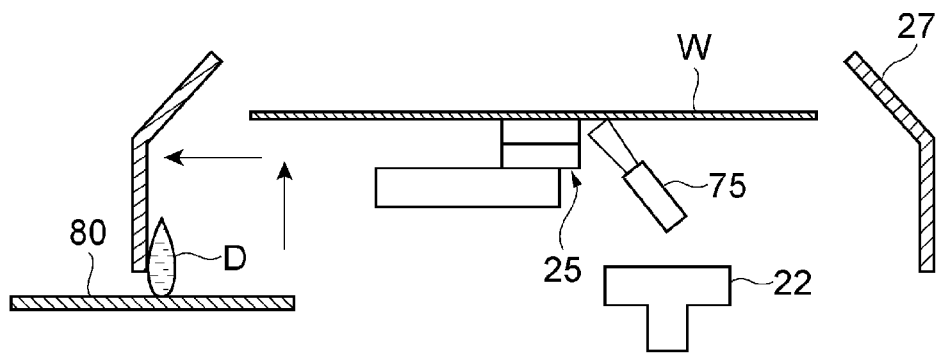
Figure 5C:
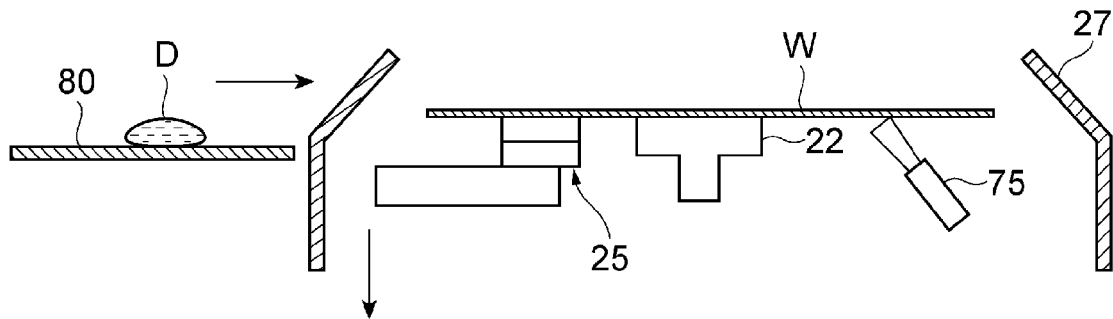

As illustrated in FIG. 5A, when the end of the back surface of the wafer W is cleaned as in the both surfaces cleaning process (step S103), the second cleaner 25 cleans the wafer W supported by the spin chuck 22. In addition, although pure water is supplied from the cleaning nozzle 75, the water droplet D of the pure water falls downward along the wall surface of the upper cup 27, and is discharged from the drain pipe 40 (see, e.g., FIG. 3). Further, in the both surfaces cleaning process illustrated in FIG. 5A, the shield 80 is disposed outside the upper cup 27, and the upper cup 27 and the shield 80 are disposed not to overlap with each other when viewed from a plan view (first processing position).

Meanwhile, in the cleaning process of the back surface (step S102), the second cleaner 25 cleans the vicinity of the center of the wafer W. Therefore, the wafer W is moved together with the upper cup 27 while the wafer W is supported by the suction pad 21 (not illustrated). At this time, the wafer W and the upper cup 27 move upward (in the positive Z axis direction), and move to the mover 73 side of the second cleaner 25 (see, e.g., FIG. 3) so that the second cleaner 25 may clean the central portion of the wafer W. As a result, as illustrated in FIG. 5B, the wafer W and the upper cup 27 move to a position in which the parts thereof overlap with the shield 80 when viewed from a plan view (second processing position), and pure water is supplied from the cleaning nozzle 75 at this position so that the second cleaner 25 performs cleaning. At this time, the water droplet D falls downward along the wall surface of the upper cup 27. As illustrated in FIG. 5B, the water droplet D may fall onto the shield 80.

When cleaning near the center of the back surface of the wafer W is completed, the wafer W is moved to the original position together with the upper cup 27, that is, the position illustrated in FIG. 5A, while being supported by the suction pad 21 (not illustrated). However, since the water droplets D dropped to the shield 80 remain, as illustrated in FIG. 5C, the water droplets D remain on the shield 80.

As described with reference to FIGS. 5A to 5C, when the back surface cleaning of the wafer W is performed in the normal procedure in the substrate processing apparatus 10, the water droplet D remains on the shield 80. By repeating the cleaning process of the wafer W or performing the process for a long time, the amount of the water droplets D remaining on the shield 80 may increase. In addition, when the substrate processing is performed in a state where the water droplets D remain on the shield 80, there is a possibility that a predetermined process may not be appropriately performed under the influence of the water droplets D.

Therefore, in the following embodiment, descriptions will be made on a configuration for preventing the water droplet D from remaining on the shield 80 when the back surface of the wafer W is cleaned in the substrate processing apparatus 10.

(First Configuration Example)

Figure 6A:
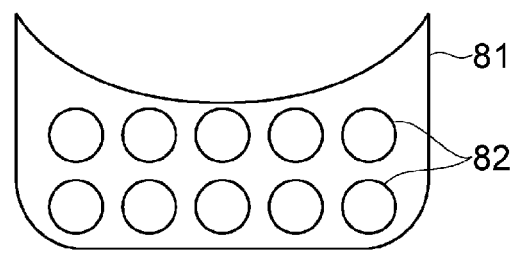
FIGS. 6A and 6B are views for explaining a first configuration example of the substrate processing apparatus according to the exemplary embodiment.

As a first configuration example, a shield is configured by a combination of two shielding plates 81 having through holes. As illustrated in FIG. 6A, the shielding plate 81 has a plurality of through holes 82 penetrating in the thickness direction. The through hole 82 may be, for example, circular, but the shape of the through hole 82 is not particularly limited. The size of the through hole 82 may be, for example, about 1 mm to 3 mm in diameter. A shield 80A is formed in a state where two such shielding plates 81 (81A, 81B) are stacked in the thickness direction. It is assumed that a plurality of through holes 82 are formed in the same pattern in the two shielding plates 81A and 81B. In this case, the shielding plates 81A and 81B are overlapped so that the through holes 82 of the two shielding plates 81A and 81B overlap with each other by about ½ to ⅓ of the size (area) of the through hole 82. As a result, a shield 80A having a through hole with a small diameter of about 0.4 mm to 0.7 mm is formed by the two shielding plates 81A and 81B.

Figure 6B:
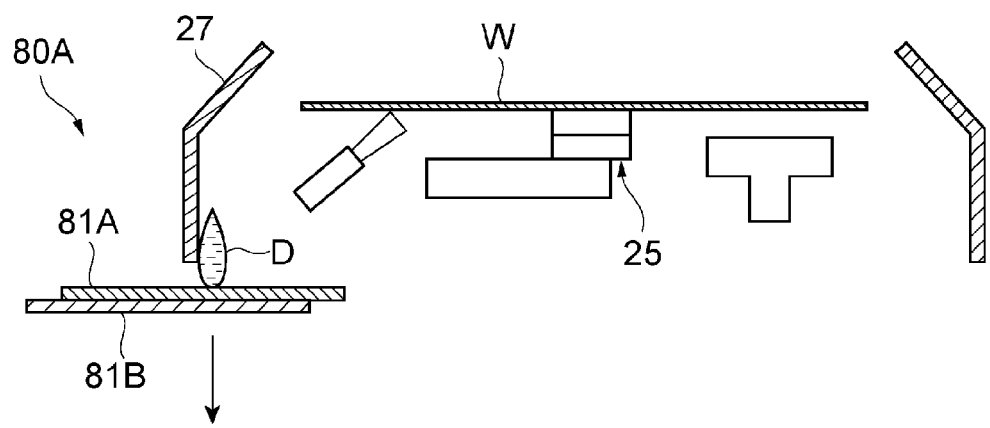

The shield 80A may cause the water droplet D to fall by utilizing the capillary phenomenon by having a small diameter through hole as described above. As illustrated in FIG. 6B, the water droplets D dropped along the upper cup 27 and dropped onto the shield 80A when cleaning the back surface of the wafer W move downward along the through holes by the capillary phenomenon of the small diameter through hole, and falls downward from the lower shielding plate 81B (to the housing 23 side). That is, the small diameter through hole formed in the shield 80A has a function as a processing liquid guide that guides the water droplet D dropped onto the shield 80A downward. Therefore, the water droplet D may be prevented from remaining on the shield 80A for a long time. Further, the size of the through hole formed in the shield 80A may be changed as appropriate according to a method of combining two shielding plates 81A and 81B. However, when the diameter of the through hole is increased, the shielding effect by the shield is reduced. Therefore, for example, by combining the two shielding plates 81A and 81B and controlling the through hole of the shield 80A so that the through hole may have a diameter sufficient for the water droplet D to fall by the capillary phenomenon, the shielding effect by the shield 80A and the falling of the water droplet D to the housing 23 side may be made compatible.

Second Configuration Example

As a second configuration example, descriptions will be made on a shield 80B that is capable of changing the relative position of the two shielding plates 81A and 81B constituting the shield.

Figure 7:
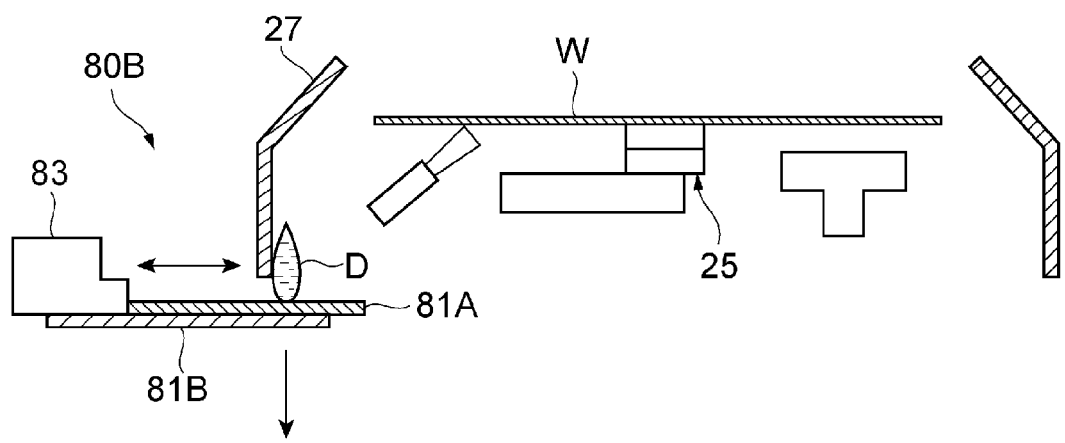
FIG. 7 is a view for explaining a second configuration example of the substrate processing apparatus according to the exemplary embodiment.

As illustrated in FIG. 7, in the shield 80B, the upper shielding plate 81A of the two shielding plates 81A and 81B stacked in the thickness direction is configured to be moved along the horizontal direction (extending direction of the shielding plates 81A and 81B) by the mover 83. The mover 83 may be configured by, for example, an air cylinder. When the shielding plate 81A may be moved relative to the shielding plate 81B by the mover 83, the positional relationship between the shielding plates 81A and 81B is controlled. For example, as illustrated in FIG. 7, when there is a possibility that the water droplet D may drop onto the shield 80B, the positional relationship between the shielding plates 81A and 81B is controlled so that a small diameter through hole is formed on the shield 80B. When the shielding plates 81A and 81B are arranged as described above, the small diameter through hole formed in the shield 80B functions as a processing liquid guide that guides the water droplet D dropped onto the shield 80B downward. Meanwhile, for example, in the stage of processing that the water droplet D does not fall (e.g., at the time of a drying process, etc.), the positional relationship between the shielding plates 81A and 81B may be controlled so that a through hole is not formed as the shield 80B. Therefore, the water droplet D may be appropriately dropped to the housing 23 side, and the shielding effect by the shield 80B may be set to be sufficiently high.

In addition, the movable shielding plate is not limited to the upper shielding plate 81A, and, for example, the lower shielding plate 81B may be configured to be movable. By changing the positional relationship between the shielding plates 81A and 81B by the mover 83, the shielding effect by the shield 80B may be compatible with the falling of the water droplet D to the housing 23 side.

Third Configuration Example

As a third configuration example, descriptions will be made on a case where although the shield itself is constituted of a normal plate-like shielding plate, the water droplet D on the shield is dropped along with the movement of the upper cup 27.

Figure 8:
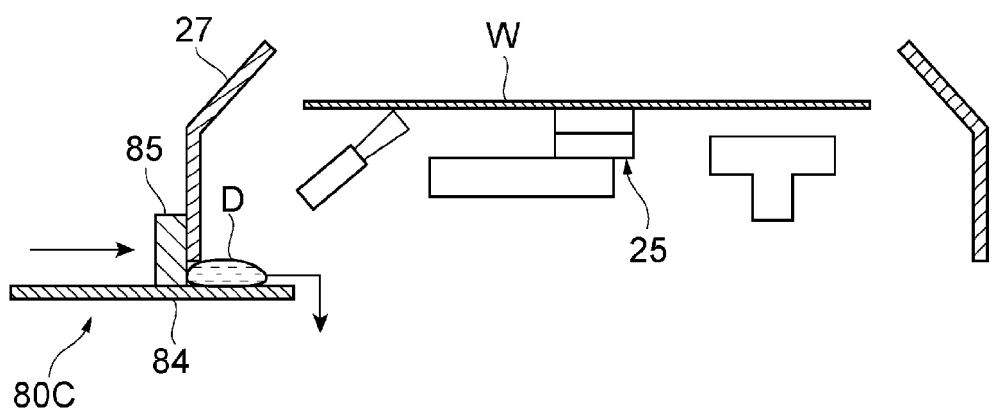
FIG. 8 is a view for explaining a third configuration example of the substrate processing apparatus according to the exemplary embodiment.

As illustrated in FIG. 8, the shield 80C is constituted by a plate-like shielding plate 84 having no through hole, like the shield 80 of the related art. Meanwhile, a webbed portion 90 is attached to the upper cup 27. When the upper cup 27 and the wafer W move to a predetermined position (second processing position) on the shield 80C (when the second cleaner 25 cleans the back surface of the wafer W), the webbed portion 90 is extended from the lower end of the upper cup 27 to contact with the upper surface of the shield 80C. The webbed portion 90 may be provided in the lower end of the upper cup 27 in a region where the upper cup 27 and the shield 80C may overlap with each other when viewed from a plan view. Further, the length of the lower portion of the webbed portion 90 from the lower end of the upper cup 27 is equal to or greater than a distance from the lower portion of the upper cup 27 to the upper surface of the shield 80C. The webbed portion 90 may be made of, for example, a material having water repellency and elasticity, such as rubber or resin. However, even when the material does not have elasticity, it is not particularly limited as long as the water droplet D on the shield 80C may be moved.

When the webbed portion 90 is provided at the lower portion of the upper cup 27, as illustrated in FIG. 8, when the upper cup 27 moves onto the shield 80C, a gap between the upper cup 27 and the shield 80C is blocked by the webbed portion 90. Therefore, when the upper cup 27 moves to a position where the upper cup 27 does not overlap with the shield 80C, the water droplets D which fall on the shield 80C along the inner wall of the upper cup 27 are dropped to the lower housing 23 side by the webbed portion 90. That is, the webbed portion 90 functions as a processing liquid guide that drops the water droplet D. Therefore, the water droplet D is prevented from remaining on the shield 80C. Further, since the through hole is not provided in the shielding plate 84 of the shield 80C, the shielding effect by the shield 80C may be kept high as in the related art.

Fourth Configuration Example

As a fourth configuration example, descriptions will be made on a case where although the webbed portion 90 is used similarly to a third configuration example, the water droplet D is dropped via the through hole of a shielding hole by using the shielding plate which has a through hole.

Figure 9A:
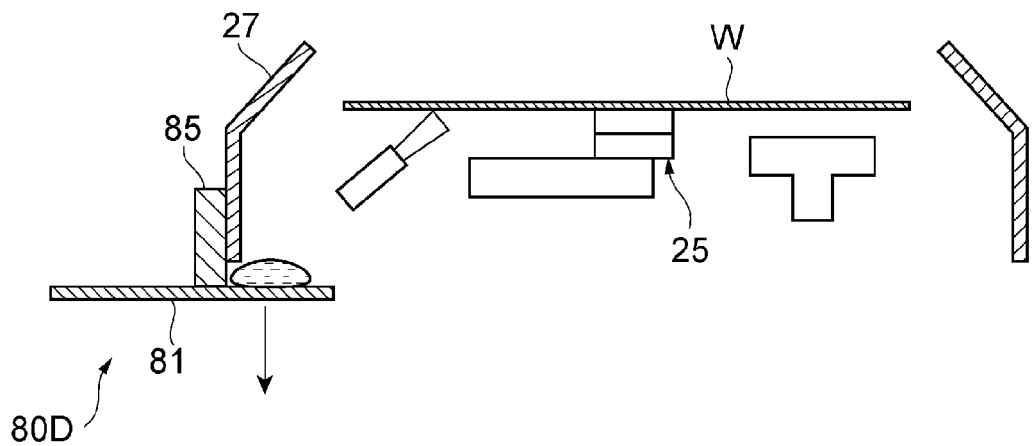
FIGS. 9A to 9C are views for explaining a fourth configuration example of the substrate processing apparatus according to the exemplary embodiment.

As illustrated in FIG. 9A, a shield 80D uses a shielding plate 81 having a through hole as in the case of the shields 80A and 80B. However, the shield 80D is constituted by only one shielding plate 81. A small diameter through hole 82 is formed in the shielding plate 81 (see, e.g., FIG. 9B). The small diameter through hole 82 is a diameter by which water may move in the through hole by the capillary phenomenon, and is, for example, about 0.3 mm to 0.8 mm Since the diameter of the through hole is small, the loss of the shielding effect is suppressed as compared to the case where the diameter is large.

Meanwhile, a webbed portion 90 is attached to the upper cup 27. When the upper cup 27 and the wafer W move to a predetermined position (second processing position) on the shield 80D (when the second cleaner 25 cleans the back surface of the wafer W), the webbed portion 90 is extended from the lower end of the upper cup 27 to contact with the upper surface of the shield 80D. The webbed portion 90 may be provided in the lower end of the upper cup 27 in a region where the upper cup 27 and the shield 80D may overlap with each other when viewed from a plan view. Further, the length of the lower portion of the webbed portion 90 from the lower end of the upper cup 27 is equal to or greater than a distance from the lower end of the upper cup 27 to the upper surface of the shield 80D. The webbed portion 90 may be made of, for example, a material having water repellency and elasticity, such as rubber or resin. However, even when the material does not have elasticity, it is not particularly limited as long as the water droplet D on the shield 80D may be moved.

Figure 9B:
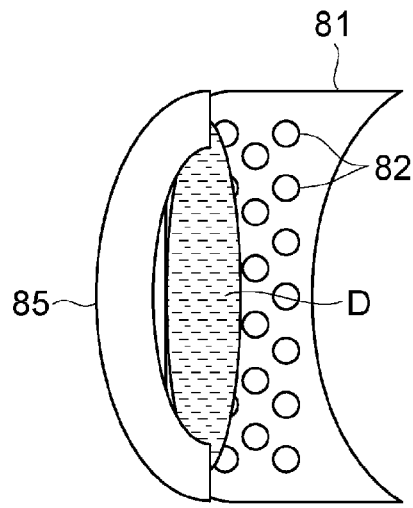
Figure 9C:
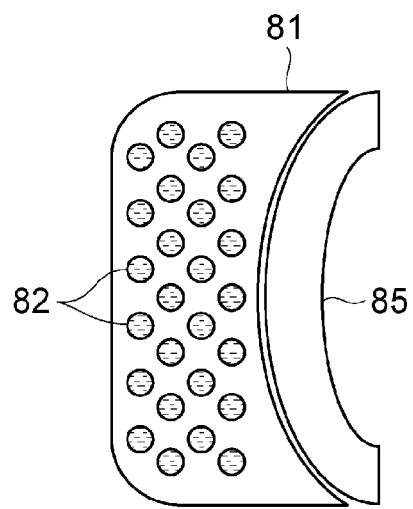

Since the webbed portion 90 is provided at the lower end of the upper cup 27, as illustrated in FIG. 9A, when the upper cup 27 moves onto the shield 80D, the gap between the upper cup 27 and the shield 80D is blocked by the webbed portion 90. Thus, the water drop D which has fallen along the inner wall of the upper cup 27 and dropped onto the shield 80D is moved by the webbed portion 90. Specifically, when the water droplet D moves to a position where the upper cup 27 does not overlap with the shield 80D, as illustrated in FIG. 9B and FIG. 9C, the water droplet D enters the through hole 82 so as to block the through hole 82 of the shielding plate 81 as the webbed portion 90 moves. The water droplet D which has entered the through hole 82 moves downward by the capillary phenomenon and falls to the housing 23 side. That is, the webbed portion 90 and the through hole 82 of the shielding plate 81 function as a processing liquid guide that causes the water droplet D to drop. Therefore, the water droplet D is prevented from remaining on the shield 80D.

According to the substrate processing apparatus described in the first to fourth configuration examples, when the upper cup is moved by the driver, even when the processing liquid drops onto the shield, the processing liquid guide causes the processing liquid dropped onto the shield to fall downward. For this reason, the processing liquid may be prevented from remaining on the shield. Therefore, as compared with a case where the processing liquid remains, the risk of quality deterioration of the substrate due to the remaining processing liquid is reduced and the efficiency of the substrate processing is improved. When the processing liquid remains on the shield, it is considered there may be a risk that the quality of the substrate after processing is degraded, such as, for example, the humidity in the substrate processing apparatus increases or a drying process is not sufficiently performed within a predetermined time. When there is such a risk, for example, a process for covering the risk may be added, such as securing a sufficient drying time, and the efficiency of substrate processing may be decreased. As described above, since the processing liquid is dropped by the processing liquid guide, the processing liquid does not remain in the shield, thereby there is no need to extend the processing time and the efficiency of substrate processing is improved.

Fifth Configuration Example

As a fifth configuration example, descriptions will be made on a configuration in which the adhesion itself of the water droplet D to the shield is avoided by changing the shapes of the shield and the upper cup.

As illustrated in FIG. 10A, a shield 80E is configured by combining plate-like shielding plates 85 and 85 which do not have through holes similarly to the shield 80 of the related art. The shielding plates 85 and 86 are overlapped in the thickness direction. Further, although the shielding plate 85 is fixed, since a spring 87 is attached to the upper shielding plate 86, the shielding plate 85 may be moved in the horizontal direction by an elastic force.

The shielding plate 85 and the shielding plate 86 are both configured to be smaller than the shielding plate that constitutes the shield 80 of the related art. Further, the region in which the shielding plates 85 and 86 are disposed when viewed from a plan view has the same size as the shield 80 in a state where no force is applied to the shielding plate 86. Therefore, the shielding effect by the shield 80E in which the shielding plates 85 and 86 are combined is similar to that of the shield 80 of the related art.

Meanwhile, the lower end of the upper cup 27 is elongated. Therefore, as illustrated in FIG. 10A, when the upper cup 27 is pulled upward for the purpose of cleaning the central portion of the wafer W, the lower end of the upper cup 27 is not disposed above the shield 80E, and is disposed at approximately the same position in the height direction. Therefore, when the upper cup 27 and the wafer W are moved to a predetermined position on the shield 80E side (second processing position) in order to bring the second cleaner 25 into contact with the central portion of the wafer W, the shield 80E does not go below the upper cup 27. As illustrated in FIG. 10B, the shielding plate 86 protruding toward the upper cup 27 in the shield 80E contacts the outer surface of the upper cup 27. However, since the shielding plate 86 is supported by the spring 87, the shielding plate 86 moves in the horizontal direction by the compression of the spring 87. As a result, as illustrated in FIG. 10B, the shield 80E is deformed together with the movement of the upper cup 27 in a state where the upper cup 27 and the shielding plate 86 are in contact with each other. That is, as a result of the overlapping area of the shielding plates 85 and 86 becoming larger, the region occupied by the shield 80E when viewed from a plan view becomes smaller. However, since the shield 80E is deformed in a state where the shielding plate 86 and the upper cup 27 are in contact with each other, the shielding effect by the shield 80E is maintained. Thus, when the upper cup 27 moves to a predetermined position on the shield 80E side (second processing position), the shielding plates 85 and 86 of the shield 80E are provided at positions not overlapping the upper cup 27 when viewed from a plan view. In addition, the shielding plates 85 and 86 are provided at the same height position as the upper cup 27 at the height position. Therefore, the outer surface of the upper cup 27 and the shielding plates 85 and 86 are disposed close to each other.

Thereafter, when the upper cup 27 is moved to the initial position, as illustrated in FIG. 10C, the shield plate 86 follows the movement of the upper cup 27 in a state where the contact between the outer surface of the upper cup 27 and the shielding plate 86 is maintained until the spring 87 reaches the maximum length. Thereafter, when the upper cup 27 moves further horizontally, as illustrated in FIG. 10D, the shielding plate 86 and the upper cup 27 are separated from each other. Then, as in the normal operation, the upper cup 27 moves downward at a predetermined position.

As described above, the shield 80E is configured to be deformable by the change in the relative position of the two shielding plates 85 and 86, and when the spring 87 is used to abut on the upper cup 27, the relative positions of the shielding plates 85 and 86 are configured to be changed. In addition, since the lower end of the upper cup 27 is long, even when the upper cup 27 moves to clean the back surface of the wafer W, the upper cup 27 does not move onto the shield 80E. For this reason, the water droplet D attached to the inner surface of the upper cup 27 does not fall onto the shield 80E. Therefore, the water droplet D is also prevented from remaining on the shield 80E. Further, since a mechanism for moving the shielding plate 86 is implemented by the spring 87, the above-described shield 80E may be implemented without using a driver for moving the shielding plate 86, etc. Thus, it is not necessary to increase the size of the apparatus.

In addition, no through hole is provided in the shielding plates 85 and 86 of the shield 80E, and the shield 80E is deformed following the movement of the upper cup 27, but this deformation prevents the opening from being made large. Therefore, the shielding effect by the shield 80E may be kept high as in the related art.

Sixth Configuration Example

As a sixth configuration example, descriptions will be made on a configuration in which the adhesion itself of the water droplet D to a shield is avoided as in the fifth configuration example by changing the shape of an upper cup and connecting a portion corresponding to the shielding plate 86 of the fifth configuration example to the upper cup.

Figure 11A:
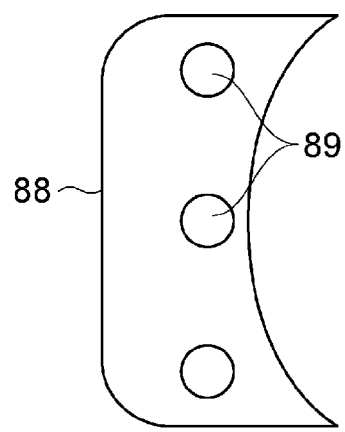
FIGS. 11A to 11C are views for explaining a sixth configuration example of the substrate processing apparatus according to the exemplary embodiment.
Figure 11B:
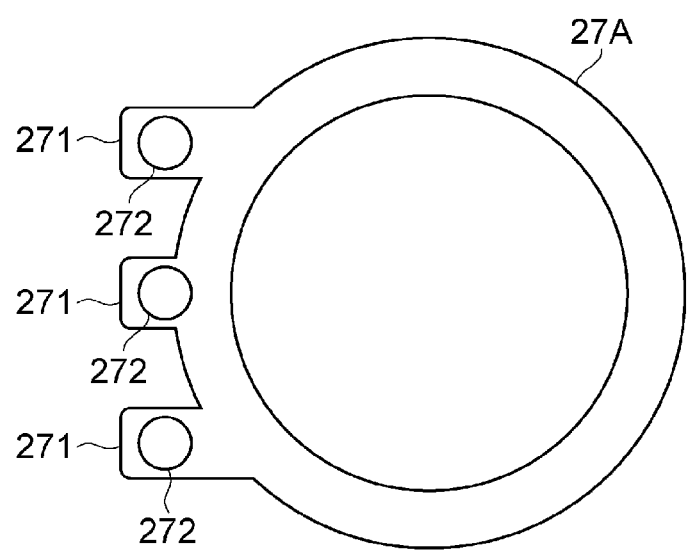
Figure 11C:
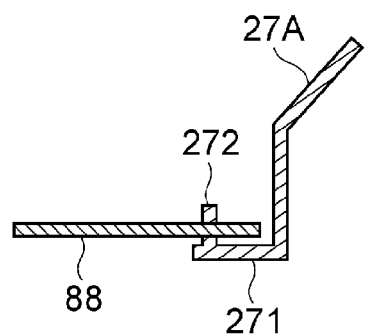

The shape change of the upper cup and the shielding plate will be described with reference to FIGS. 11A to 11C. FIG. 11A illustrates a shielding plate 88 attached to the upper cup. The shielding plate 88 has a shape that covers a part of the region occupied by the shield similarly to the shielding plate 86. In addition, the shielding plate 88 has three openings 89 that are attached to the upper cup. The arrangement and shape of the openings 89 correspond to the shape of the upper cup. FIG. 11B is a plan view of an upper cup 27A in the sixth configuration example. Further, FIG. 11C represents a method of attaching the shielding plate 88 to the upper cup 27A. The upper cup 27A is provided at its lower end with three flange units 271 that protrude from the upper cup 27A toward the shield. A convex portion 272 which protrudes upward from the flange unit 271 is provided in each of the flange units 271. When the shielding plate 88 and the upper cup 27A are combined, the convex portions 272 provided in the three flange units 271 of the upper cup 27A are caused to pass through the three openings 89 of the shielding plate 88, respectively. As a result, as illustrated in FIG. 11C, the convex portion 272 passes through the opening 89 of the shielding plate 88.

In addition, the shielding plate 88 is not always attached to the upper cup 27A, but when the upper cup 27A moves to clean the back surface of the wafer W and the convex portion 272 of the upper cup 27A penetrates the opening 89 of the shielding plate 88, the opening 89 of the shielding plate 88 and the convex portion 272 of the upper cup 27A are integrated. Therefore, when the convex portion 272 of the upper cup 27A is out of the opening 89 of the shielding plate 88, both are separated from each other.

Next, the operation of a shield 80F by the shielding plate 88 that may be attached to the upper cup 27A and the shielding plate 85 on the housing 23 side will be described with reference to FIGS. 12A to 12D. Meanwhile, the shielding plate 85 used for the shield 80F is the same as the shielding plate 85 used by the shielding part 80E of the fifth configuration example.

Figure 12A:
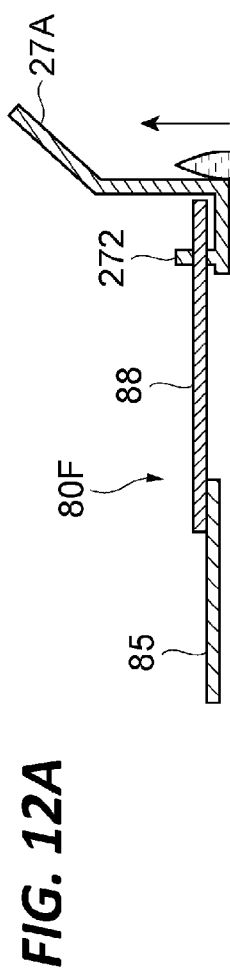
FIGS. 12A to 12D are views for explaining a sixth configuration example of the substrate processing apparatus according to the exemplary embodiment.
Figure 12B:
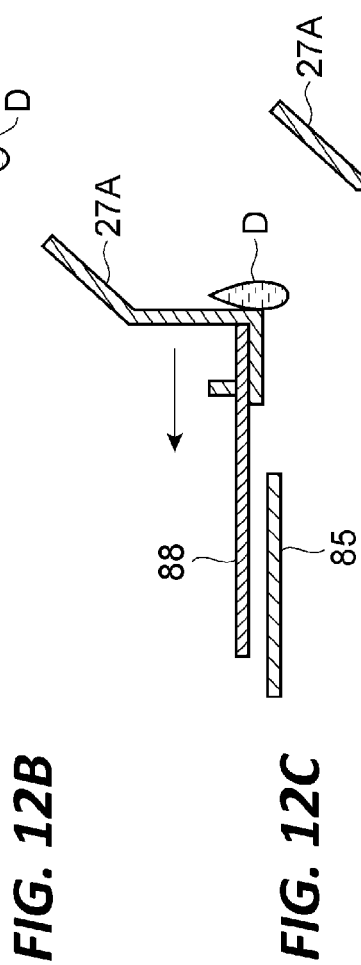

When the upper cup 27A is pulled upward for the purpose of cleaning the central portion of the wafer W, as illustrated in FIG. 12A, the convex portion 272 provided on the upper cup 27A passes through the opening 89 of the shielding plate 88 (not illustrated). Therefore, the upper cup 27A and the shielding plate 88 are integrated. In this state, in order to bring the second cleaner 25 into contact with the central portion of the wafer W, the upper cup 27A and the wafer W are moved to a predetermined position on the shielding plate 85 side (second processing position). Then, as illustrated in FIG. 12B, the shielding plate 88 integrated with the upper cup 27A in the shield 80F moves in the horizontal direction together with the upper cup 27A. As a result, as illustrated in FIG. 12B, the shielding plate 86 of the upper cup 27A moves above the shielding plate 85, and the overlapping area of the shielding plates 85 and 86 becomes larger. As a result, the region occupied by the shield 80F when viewed from a plan view is reduced. However, the shielding effect by the shield 80F is maintained.

Figure 12C:
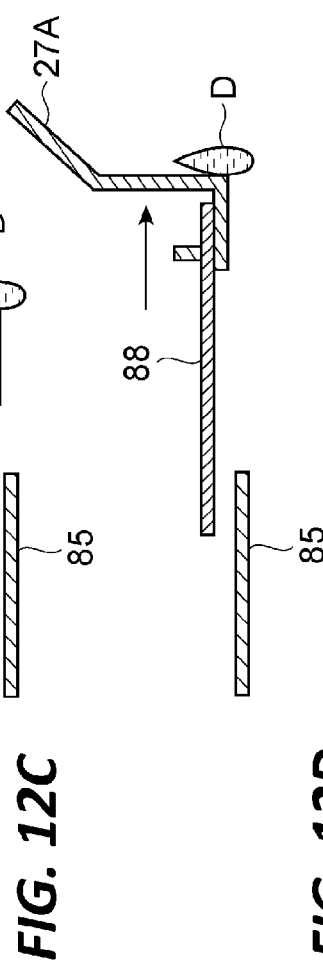
Figure 12D:
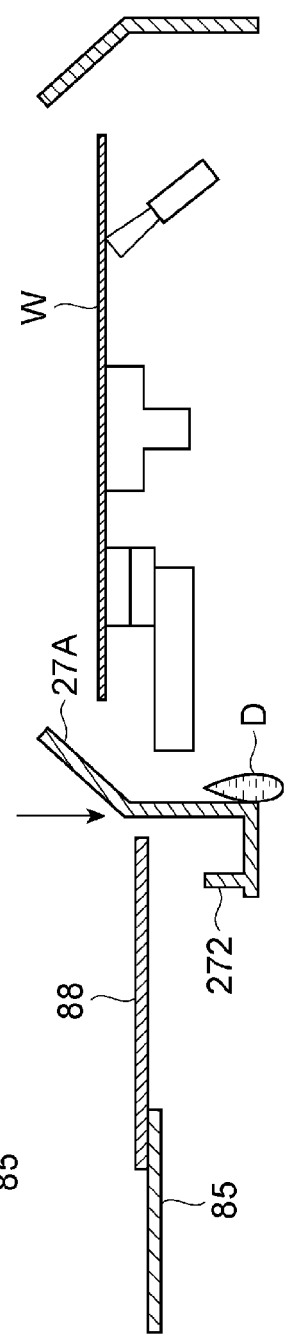

Thereafter, when the upper cup 27A is horizontally moved to the original position, as illustrated in FIG. 12C, the upper cup 27A and the shield plate 88 are horizontally moved in a state of being integrated. Thereafter, when the upper cup 27A moves in the vertical direction, as illustrated in FIG. 12D, the convex portion 272 of the upper cup 27A is disengaged from the opening 89 of the shielding plate 88, and the shielding plate 88 and the upper cup are separated from each other. The shielding plate 88 is in a state in which the end thereof overlaps with the shielding plate 85.

Thus, the shield 80F is deformable by the change in the relative position of the two shielding plates 85 and 88. This point is the same as that of the fifth configuration example. Further, when the upper cup 27 moves to a predetermined position on the shield 80E side (second processing position), the shielding plates 85 and 88 of the shield 80F are provided at a position not overlapping the upper cup 27 when viewed from a plan view, and are provided at the same height position as the upper cup 27 at the height position. Therefore, the outer surface of the upper cup 27 and the shielding plates 85 and 88 are disposed close to each other. This point is also the same as that of the fifth configuration example.

Further, the shield 80F of the sixth configuration example is configured such that the relative position of the shielding plates 85 and 88 is changed by the upper cup 27A and the shielding plate 88 integrated and moving horizontally by the movement of the upper cup 27A. In addition, since the upper cup 27A moves in a state where the shielding plates 85 and 88 are disposed outside the upper cup 27A, the upper cup 27A does not move onto the shield 80F even when the upper cup 27A moves to clean the back surface of the wafer W. For this reason, the water droplet D attached to the inner surface of the upper cup 27 does not fall onto the shield 80F. Therefore, the water droplet D is also prevented from remaining on the shield 80F. Further, since the above-described shield 80F may be implemented without using a driver, etc. in accordance with the movement of the shielding plate 88, it is not necessary to increase the size of the apparatus.

In addition, no through hole is provided in the shielding plates 85 and 88 of the shield 80F, and the shield 80F is deformed following the movement of the upper cup 27, but this deformation prevents the opening from being made large. Therefore, the shielding effect by the shield 80F may be kept high as in the related art.

In addition, the structure that enables the shielding plate 88 and the upper cup 27 to be integrated and separated is not limited to the configuration using the opening on the shielding plate 88 side and the convex portion 272 on the upper cup 27 side. For example, the arrangement of the opening and the projection may be reversed. Also, an entirely different structure may be used to implement integration and separation of the shielding plate 88 and the upper cup 27.

According to the substrate processing apparatus described in the fifth and sixth configuration examples, when the liquid receiving cup is disposed at the second processing position, the shield is provided at a position not overlapping the liquid receiving cup when viewed from a plan view. Further, the shield is configured by a shielding plate provided at the same height position as the liquid receiving cup in the height position. In the case of the above-described configuration, since the processing liquid does not fall from the liquid receiving cup or the like to the shielding plate, adhesion itself of the processing liquid on the shield is prevented. Therefore, similarly to the substrate processing apparatus described in the first to fourth configuration examples, it is possible to avoid a decrease in substrate processing efficiency when the processing liquid remains on the shield, and the substrate processing efficiency is improved.

Seventh Configuration Example: Configuration Example of Partition in Housing

Next, a configuration change in the housing will be described as a seventh configuration example. The configuration of the housing described as the seventh configuration example may be combined with the shields 80A to 80F described in the first to sixth configuration examples.

Figure 13A:
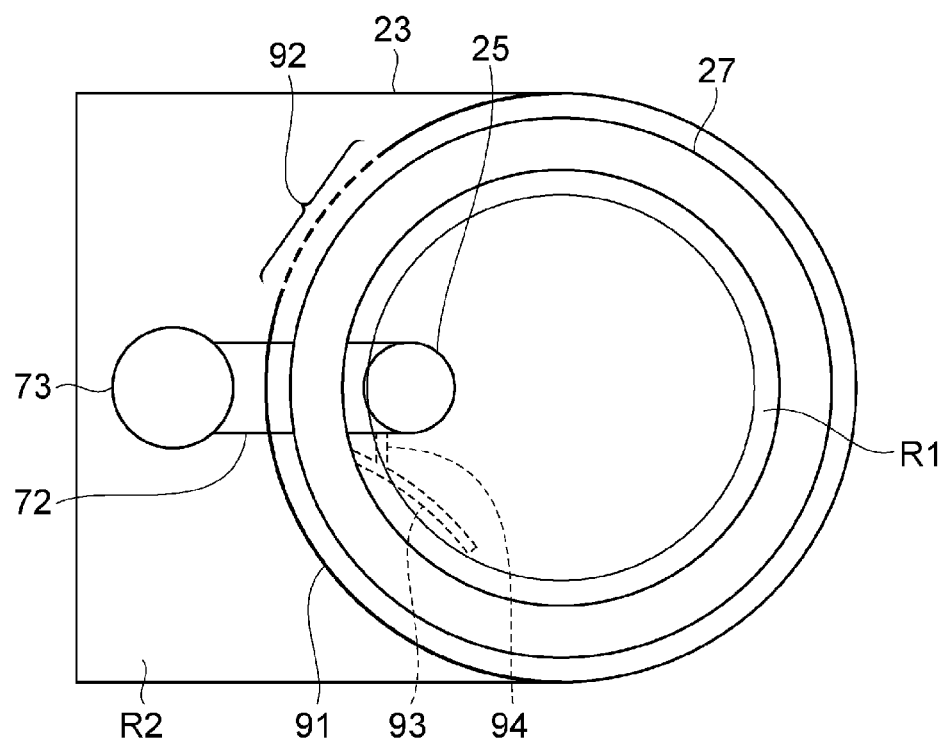
FIGS. 13A and 13B are views for explaining a seventh configuration example of the substrate processing apparatus according to the exemplary embodiment.
Figure 13B:
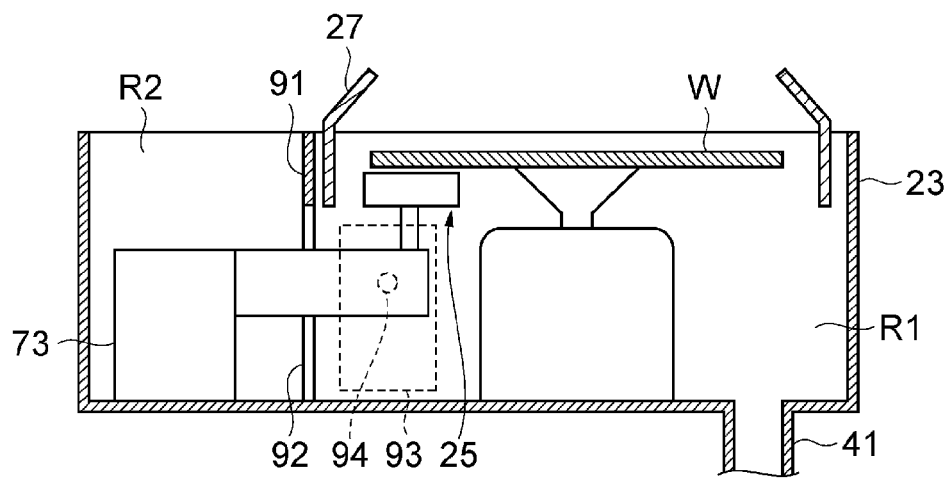

FIGS. 13A, 13B, 14A and 14B are views for explaining a modification of the structure around the housing 23 and the second cleaner 25. First, as illustrated in FIGS. 13A and 13B, when the inside of the housing 23 is divided into a region R1 on the upper cup 27 side used to clean the wafer W, and a region R2 in which the second cleaner 25 is disposed when the second cleaner 25 is retracted to the mover 73 side. Then, a wall portion 91 is provided between the region R1 and the region R2. The region R1 includes a cleaning position at which the second cleaner 25 performs a cleaning, and the region R2 includes a retracting position at which the second cleaner 25 retracts.

The wall portion 91 is provided outside the upper cup 27 when viewed from a plan view, as illustrated in FIG. 13A. The wall portion 91 may be formed continuously from, for example, the shield (see the first to sixth configuration examples), or may be formed to extend from the bottom portion of the housing 23 (i.e., the bottom portion of the processing chamber). The structure of the wall portion 91 is not particularly limited as long as the room may be divided.

However, the second cleaner 25 and the arm 72 supporting the second cleaner 25 move between the region R1 and the region R2 while rotating. Therefore, as illustrated in FIGS. 13A and 13B, the window 92 is formed in the wall portion 91 at a portion where the second cleaner 25 and the arm 72 interfere with the wall portion 91. Meanwhile, since the region where the second cleaner 25 and the arm 72 interfere with the wall portion 91 changes in accordance with the movable range of the arm 72 and the like, the position where the window 92 is formed may be changed appropriately. The window 92 is formed so that the wall portion 91 does not interfere with the operation of cleaning the back surface of the wafer W performed using at least the second cleaner 25.

Since the window 92 is provided, the region R1 and the region R2 are in communication with each other. However, when the second cleaner 25 does not perform a cleaning, that is, when the second cleaner 25 retracts to the mover 73 side, the cover 93 is attached to the arm 72 via the support member 94 so that the window 92 is blocked. The cover 93 corresponds to the shape of the window 92. Further, the support member 94 supports the cover 93 so that the cover 93 is disposed at a position corresponding to the window 92 when the second cleaner 25 is retracted to the mover 73 side. That is, the wall portion 91 provided with the window 92 and the cover 93 serve as a partition that divides the region R1 and the region R2.

Figure 14A:
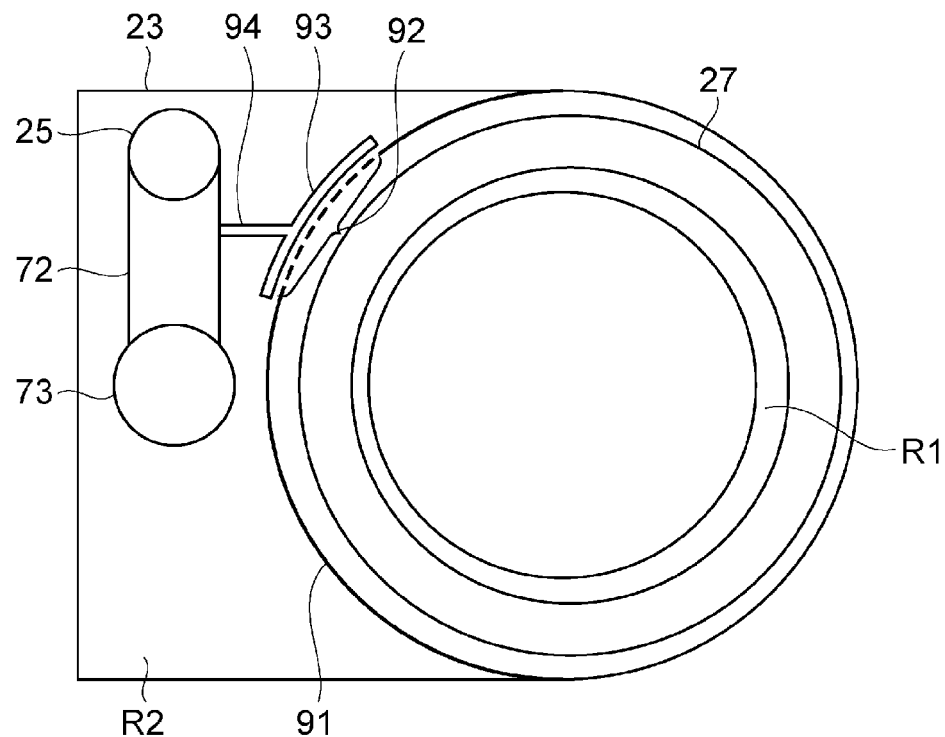
FIGS. 14A and 14B are views for explaining a seventh configuration example of the substrate processing apparatus according to the exemplary embodiment.
Figure 14B:
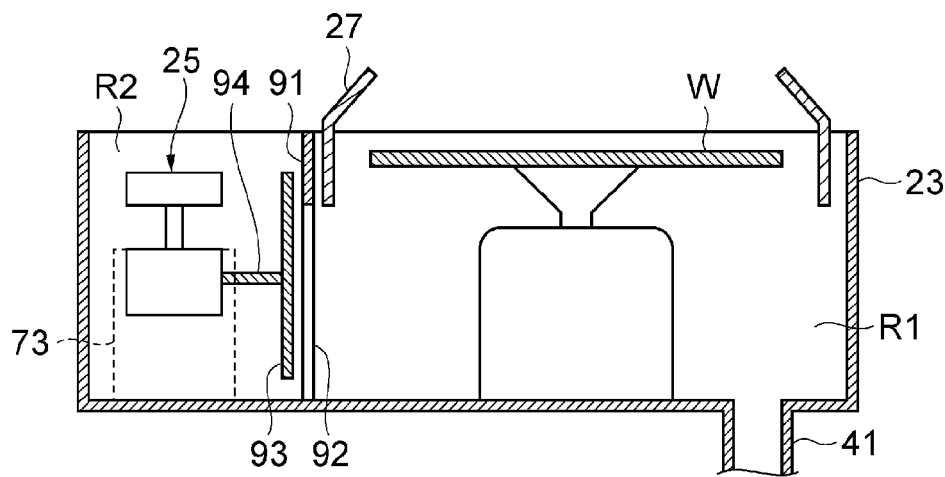

FIGS. 14A and 14B illustrate a state in which the second cleaner 25 is retracted to the mover 73 side (the region R2 side). As illustrated in FIGS. 14A and 14B, when the second cleaner 25 is retracted to the mover 73 side, the cover 93 is provided at a position corresponding to the window 92 of the wall portion 91. As a result, as illustrated in FIG. 14B, etc., the region R1 and the region R2 are divided by the wall portion 91 and the cover 93.

The effect of dividing the region R1 and the region R2 by the wall portion 91 and the cover 93 will be described. As described above, the exhaust pipe 41 is provided in the substrate processing apparatus 10 to form a downward air flow and exhaust the air flow. By exhausting the air flow in the housing 23 by the exhaust pipe 41, discharge of mist, water vapor, and the like generated by the spray of pure water and the like is also performed. The discharge of mist and water vapor by the exhaust pipe 41 becomes important in the drying process (step S104: see, e.g., FIG. 4). However, when the wall portion 91 and the cover 93 are not provided, since the gas on the region R2 side where the second cleaner 25 retracts is also discharged to the outside, there is room for improvement in the exhaust efficiency when the drying process is considered. When exhaust by the exhaust pipe 41 is performed after the region R1 and the region R2 are divided by using the wall portion 91 and the cover 93, the space to be exhausted becomes narrow, so that the exhaust efficiency is improved.

Thus, the wall portion 91 and the cover 93 divide the inside of the housing 23 into the region R1 in which the upper cup 27 is provided (i.e., the region to be subjected to the drying process according to the wafer W) and the region R2 different from the region R1 (i.e., the region in which the substrate holder is provided). As a result of such a configuration, the exhaust efficiency by the exhaust pipe 41 is enhanced in the region R2, and the substrate processing efficiency is improved.

In the meantime, in the seventh configuration example, descriptions have been made on a case where the cover 93 is attached to the arm 72 supporting the second cleaner 25, but the attachment position of the cover 93 to block the window 92 of the wall portion 91 may be appropriately changed. Therefore, the arm 72 may be replaced with the second cleaner 25 unless it interferes with the cleaning. Further, the cover may be attached to the body of the partition, that is, the wall portion 91 side. For example, a cover that may slide relative to the wall portion 91 is provided as an element corresponding to the cover 93, and when the second cleaner 25 is retracted, the cover may be configured to be slid to close the window 92. As described above, the configuration according to the cover is not particularly limited.

MODIFICATION

Next, a substrate processing apparatus and a substrate processing method according to a modification will be described.

The procedure of the substrate processing by the substrate processing apparatus is not limited to the above, and may be appropriately changed. For example, the front surface cleaning process may be separately performed in addition to the back surface cleaning process and the both surfaces cleaning process.

The structure and shape of the substrate processing apparatus described above may be changed as appropriate. For example, the arrangement/structure of the first cleaner and the second cleaner, the shape of the housing, and the like are not limited to the above embodiment. Further, the operation of the arm performed when the first cleaner and the second cleaner clean the wafer may be appropriately changed by combining rotational movement and horizontal movement.

According to a substrate processing apparatus and a substrate processing method according to an exemplary embodiment, processing efficiency related to cleaning of a substrate is enhanced.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate processing apparatus comprising:
a substrate holder;
a processing liquid supply nozzle that supplies a processing liquid to a substrate held by the substrate holder;
a liquid receiving cup that receives the processing liquid supplied to the substrate;
a processing chamber that accommodates the liquid receiving cup and has an opening at an upper side;
a shield that shields a region outside the liquid receiving cup in the opening of the processing chamber, the shield including an upper shielding plate stacked on a lower shielding plate; and
a driver that moves the liquid receiving cup between a first processing position separated from the shield and a second processing position overlapping above the shield when viewed in a plan view;
wherein each of the upper shielding plate and the lower shielding plate have a plurality of through holes in a thickness direction thereof, the through holes of the upper shielding plate and the through holes of the lower shielding plate being overlapped to form a plurality of through passages that penetrate the shield in the thickness direction,
the plurality of through passages each being sized to allow the processing liquid to fall therethrough in the second processing position, and
wherein the through holes of the upper shielding plate and the through holes of the lower shielding plate are overlapped with each other by ½ to ⅓ an area of each through hole.

2. The substrate processing apparatus according to claim 1, further comprising:
a mover that moves one of the upper shielding plate and the lower shielding plate of the shield along an extending direction with respect to the other of the upper shielding plate and the lower shielding plate.

3. The substrate processing apparatus according to claim 2, further comprising a controller configured to control the mover so as to form the plurality of through passages in the shield when the processing liquid drops onto the shield and not to form the plurality of through passages in the shield when the processing liquid does not drop.

4. The substrate processing apparatus according to claim 1, wherein the through holes of the upper shielding plate and the through holes of the lower shielding plate have a diameter of 1 mm to 3 mm.

* * * * *